US008926251B2

(12) United States Patent
Iizuka et al.

(10) Patent No.: US 8,926,251 B2
(45) Date of Patent: Jan. 6, 2015

(54) CONTAINER STORAGE FACILITY

(75) Inventors: Yukio Iizuka, Shiga (JP); Suguru Shibata, Komaki (JP)

(73) Assignee: Daifuku Co., Ltd., Osaka (JP)

(*) Notice: Subject to any disclaimer, the term of this patent is extended or adjusted under 35 U.S.C. 154(b) by 641 days.

(21) Appl. No.: 13/211,757

(22) Filed: Aug. 17, 2011

(65) Prior Publication Data

US 2012/0045302 A1    Feb. 23, 2012

(30) Foreign Application Priority Data

Aug. 20, 2010  (JP) ................................. 2010-184827

(51) Int. Cl.
*H01L 21/677* (2006.01)
*H01L 21/673* (2006.01)

(52) U.S. Cl.
CPC .... *H01L 21/67769* (2013.01); *H01L 21/67389* (2013.01); *H01L 21/67393* (2013.01)
USPC ............ 414/217; 414/293; 414/266; 414/278

(58) Field of Classification Search
USPC .......... 414/217, 293, 266, 278, 277, 282, 373
See application file for complete search history.

(56) References Cited

U.S. PATENT DOCUMENTS

| 8,082,955 | B2 * | 12/2011 | Okabe | 141/51 |
| 2004/0047714 | A1 * | 3/2004 | Poli et al. | 414/281 |
| 2011/0056900 | A1 | 3/2011 | Inui et al. | |

FOREIGN PATENT DOCUMENTS

| JP | 6156622 | A | 6/1994 |
| JP | 727483 | A | 1/1995 |
| JP | 1194681 | A | 4/1999 |
| JP | 2001338971 | A | 12/2001 |
| JP | 200686308 | A | 3/2006 |
| JP | 2007227800 | A | 9/2007 |
| JP | 2009253162 | A | 10/2009 |
| WO | 9627417 | A1 | 9/1996 |

* cited by examiner

*Primary Examiner* — Saul Rodriguez
*Assistant Examiner* — Willie Berry, Jr.
(74) *Attorney, Agent, or Firm* — The Webb Law Firm

(57) ABSTRACT

The present invention provides a container storage facility in which inert gas can be supplied to a container in a container storage section that can be moved between the storage position and the transfer position while preventing deterioration of the gas supply line and generation of dust to the extent possible. The container storage section of the container storage facility in accordance with the present invention includes a container support provided to be movable with respect to the fixed frame member between a storage position and a transfer position for transferring the container to and from a transporting device. The gas supply line of gas supply system for supplying the inactive gas to the container supported by the container support of the storage position includes a fixed side portion and a moving side portion which can be moved in unison with the container support. And there is provided a connecting member for connecting the fixed side portion and the moving side portion to each other as the container support is moved from the transfer position to the storage position, and for releasing the connection between the fixed side portion and the moving side portion to allow the moving side portion to move away from the fixed side portion as the container support is moved from the storage position to the transfer position.

14 Claims, 10 Drawing Sheets

CONTAINER STORAGE FACILITY

BACKGROUND OF THE INVENTION

1. Field of the Invention

The present invention relates to a container storage facility comprising a vehicle for transporting a container for holding at least one substrate, and a container storage section for storing the container transported by the vehicle.

2. Description of the Related Art

In the container storage facilities described above, transporting means including a vehicle is provided for transporting containers among a plurality of processing devices for processing substrates which have been, for example, taken out of containers. Container storage sections are provided, for example, to temporarily store containers before they are transported to the processing device, or to store the containers that have been processed by the processing device and that are destined to be moved out of the facility. Each container storage sections is configured to be capable of transferring (i.e. delivering and receiving) a container to and from the transporting means.

In this container storage facility, a storage shelf is conventionally provided that includes a plurality of container storage units which are each capable of storing a container and which are arranged in the vertical direction and the horizontal direction. There are some conventional facilities in which this storage shelf function as a container storage section. (See for example, Japanese Publication Of Application No. 2001-338971.) In the facility described in this publication, the storage shelf is configured to be a stationary type installed on the floor surface, and its transporting means is configured to transfer containers to and from the plurality of the fixed container storage units.

And there is also another type of container storage facility in which a plurality of container storage sections are arranged along the travel path of the transporting means. (See, for example, Japanese Publication Of Application No. 2009-253162.) In the facility described in this publication, each container storage section includes a fixed frame immovably or fixedly provided and a container support provided for movement with respect to the fixed frame between a storage position for storing a container and a transfer position for transferring a container to and from the transporting means. When transferring a container between the transporting means and the container storage section, the container support located in the storage position is moved from the storage position to the transfer position. The transporting means then transfers the container to or from the container support located in the transfer position. When the transfer is completed, the container support is returned from the transfer position to the storage position.

As described above, as the container storage section, there is the container storage section of a fixed type disclosed in Japanese Publication Of Application No. 2001-338971 as well as the container storage section which can be moved between the storage position and transfer position as disclosed in Japanese Publication Of Application No. 2009-253162. In a conventional container storage facility, both the container storage section of the fixed type and the container storage section which can be moved between the storage position and the transfer position are provided as its container storage sections. The transporting means can move to and from the container storage section of the fixed type and is configured to transfer a container to and from the container storage section of the fixed type. The transporting means can also move to and from the container storage section which can be moved between the storage position and the transfer position and is configured to transfer a container to or from the container storage section that had been moved from the storage position to the transfer position.

The space within the container is filled with inert gas, such as nitrogen or argon, or with CDA (Clean Dry Air) in order to prevent an oxide film due to oxygen in the air from forming on the surfaces of the substrates (for example, semiconductor wafer) in the container. To this end, in the facility discussed in the Japanese Publication Of Application No. 2001-338971, gas supply means is provided for supplying inert gas to the container stored in a container storage section of the fixed type. A supply port for supplying the nitrogen gas to the interior of the container and an exhaust port for releasing the air containing oxygen from the interior of the container are provided to the container. The gas supply means supplies the inert gas through the supply port of the container stored in the storage shelf, replaces the internal air, and fills the container with the inert gas.

Thus, the container storage section has been contemplated as a location at which inert gas is supplied to the container. However, while gas supply means is provided to the container storage section of the fixed type as described in Japanese Publication Of Application No. 2001-338971, no gas supply means is provided to the container storage section which can be moved between the storage position and the transfer position as described in Japanese Publication Of Application No. 2009-253162, making it impossible to fill the container with inert gas at such storage section. Thus, the container that needs to be filled with inert gas is conventionally transported by the transporting means, not to the container storage section which can be moved between the storage position and the transfer position, but to the container storage section of the fixed type which can supply inert gas to the container to fill the space within the container with inert gas.

However, since it is necessary to secure installation space on the floor surface for other devices such as the processing devices that actually contribute directly to production of the substrates, it is difficult to install a plurality of storage shelves close to the processing devices. Therefore, in a facility where the container storage sections of the fixed type are the only locations at which inert gas is supplied to the containers, the distance, which the transporting means has to cover to transport the containers to container storage sections for storing the containers after being processed by processing devices, becomes long, using up transporting capacity of the transporting means, which leads to a problem of not using the transporting capacity of the transporting means effectively.

And, the container storage section which can be moved between the storage position and the transfer position requires a smaller installation space compared with the container storage section of the fixed type, and can be installed in the ceiling where comparatively large space is available. Accordingly, it is also contemplated to provide facilities recently in which a large number of container storage sections which can be moved between the storage position and the transfer position are installed in lieu of the container storage section of the fixed type, or without any container storage section of the fixed type. In such facility, since there would be a smaller number of the container storage sections of the fixed type which can supply inert gas to the containers, it is desirable to have the container storage sections which can be moved between the storage position and the transfer position and that can supply inert gas to the containers.

To this end, it would be possible to supply inert gas to the container by providing the container storage section which can be moved between the storage position and the transfer position with a gas supply line that can be extended and retracted with the movement of the container support when it is moved between the transfer position and the storage position. However, in this case, since the gas supply line would be extended and retracted every time the container support is moved between the transfer position and the storage position, the gas supply line would deteriorate prematurely. And, when the gas supply line is extended and retracted, dust is generated, which is not desirable in ensuring high quality of the substrates.

SUMMARY OF THE INVENTION

The present invention was made in light of the present state of the art described above. And its object is to provide a container storage facility which overcomes at least one of the disadvantages in the conventional technology.

In order to achieve this object, the container storage facility in accordance with the present invention comprises transporting means for transporting a container for holding at least one substrate, and a container storage section for storing the container transported by the transporting means. The container storage section includes a fixed frame member fixedly provided and a container support provided to be movable with respect to the fixed frame member between a storage position for storing the container and a transfer position for transferring the container to or from the transporting means. Gas supply means for supplying inert gas, through a gas supply line, to the container supported by the container support located at the storage position is provided, wherein the gas supply line includes a fixed side portion provided to the fixed frame member and a moving side portion provided to the container support so as to be movable in unison with the container support. There is provided a connecting member for connecting the fixed side portion and the moving side portion to each other as the container support is moved from the transfer position to the storage position, and for releasing the connection between the fixed side portion and the moving side portion to allow the moving side portion to move away from the fixed side portion as the container support is moved from the storage position to the transfer position.

With this configuration, a container can be transferred to or from the article transport means when the container support is located at the transfer position, and can be stored when the container support is located in the storage position. And, the container transported by the transporting means can be stored in the container storage section. Therefore, the container transported by the transporting means can be stored in the container storage section. And since the gas supply means for supplying inert gases through the gas supply line to the container supported by the container support located in the storage position is provided, inert gases can be supplied to the container when the container is stored in the container storage section.

And since the gas supply line includes a fixed side portion provided to the fixed frame member and a moving side portion provided to the container support so as to be movable in unison with the container support, and since the connecting member connects the fixed side portion and the moving side portion to each other as the container support is moved from the transfer position to the storage position, and releases the connection between the fixed side portion and the moving side portion to allow the moving side portion to move away from the fixed side portion as the container support is moved from the storage position to the transfer position, the shape of the fixed side portion and the shape of the moving side portion can be maintained even if the container support is moved between the transfer position and the storage position. Accordingly, since the gas supply line is not deformed to as great an extent as the moving distance of the container support, the gas supply line would not be deteriorated by deformation even if the container support is moved repeatedly. Therefore, generation of dusts due to deterioration of the gas supply line can be prevented to the extent possible.

Thus, with the configuration described above, a container storage facility is provided in which inert gas can be supplied to a container in a container storage section that can be moved between the storage position and the transfer position while preventing deterioration of the gas supply line and generation of dust to the extent possible.

Further, a container storage facility in accordance with the present invention may comprise: a vehicle for transporting a container for holding at least one substrate; a container storage section for storing the container transported by the vehicle, wherein the container storage section includes a fixed frame member fixedly provided and a container support configured to be moved with respect to the fixed frame member between a storage position for storing the container and a transfer position for transferring the container to or from the vehicle; a gas supply system for supplying inert gas, through a gas supply line, to the container supported by the container support located at the storage position is provided, wherein the gas supply line includes a fixed side portion provided to the fixed frame member and a moving side portion provided to the container support so as to be moved in unison with the container support; a connecting member provided to the gas supply system for connecting the fixed side portion and the moving side portion to each other as the container support is moved from the transfer position to the storage position, and for releasing the connection between the fixed side portion and the moving side portion to allow the moving side portion to move away from the fixed side portion as the container support is moved from the storage position to the transfer position.

DESCRIPTION OF THE PREFERRED EMBODIMENTS

The preferred embodiment of a container storage facility in accordance with the present invention is described with reference to the drawings. This container storage facility is installed, for example, in a clean room provided with downflow type clean air ventilation means which causes clean air to flow from a ceiling side to a lower part of the clean room.

Figure 1:
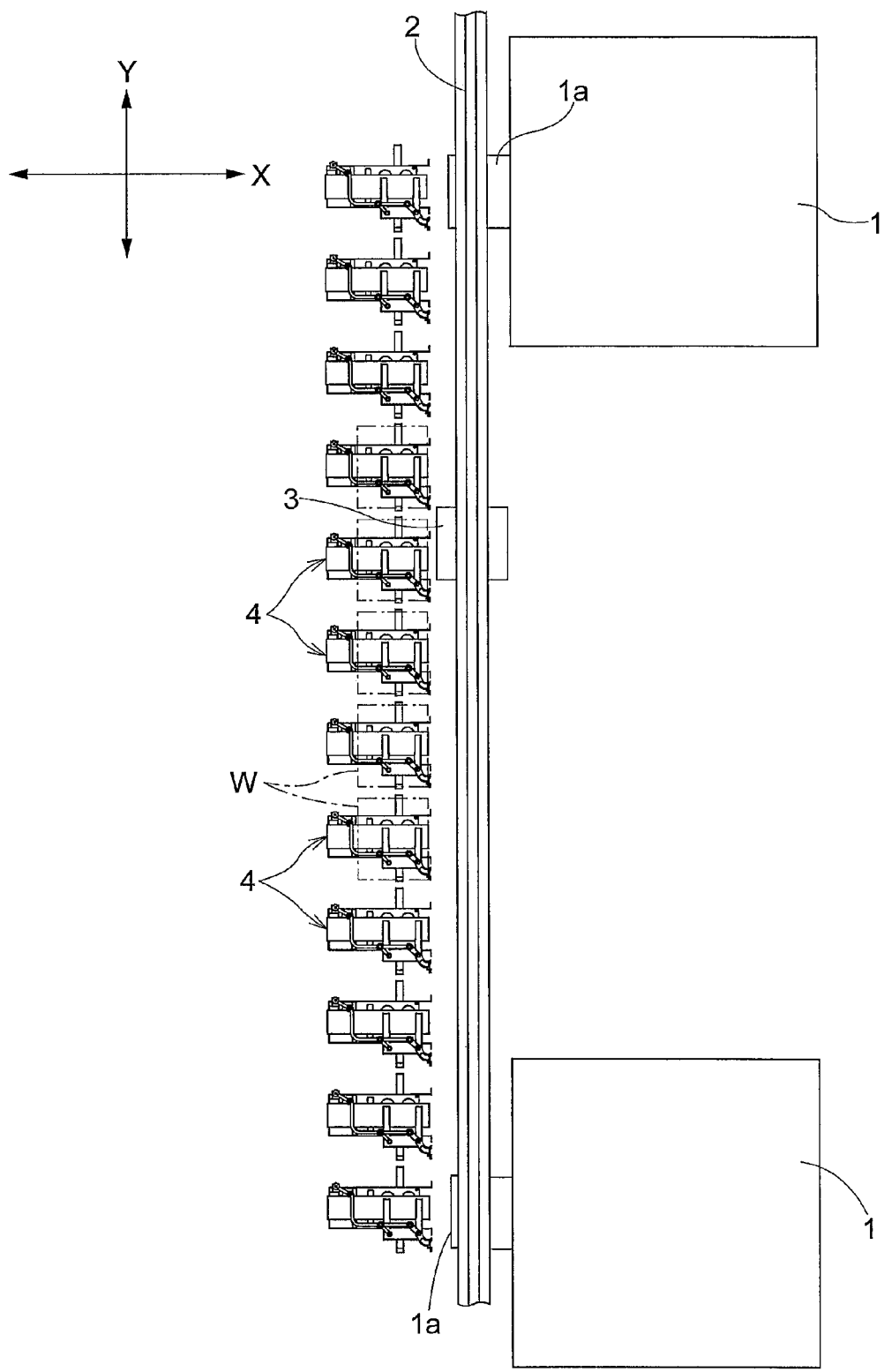
FIG. 1 is a plan view of the entire article storage facility.

As shown in FIG. 1, the container storage facility includes travel rails 2 (which corresponds to a travel path) is installed on a ceiling side such that the rails 2 extend by way of or adjacent to a plurality of processing devices 1, and at least one article transport vehicle 3 (which corresponds to a vehicle) which can travel along this travel rail 2. The article transport vehicle 3 is configured to transport a container W containing semiconductor substrates (an example of substrates) among the plurality of processing devices 1. Each processing device 1 is configured to perform a predetermined process on work-in-process parts in a manufacturing of semiconductor substrates etc.

Figure 2:
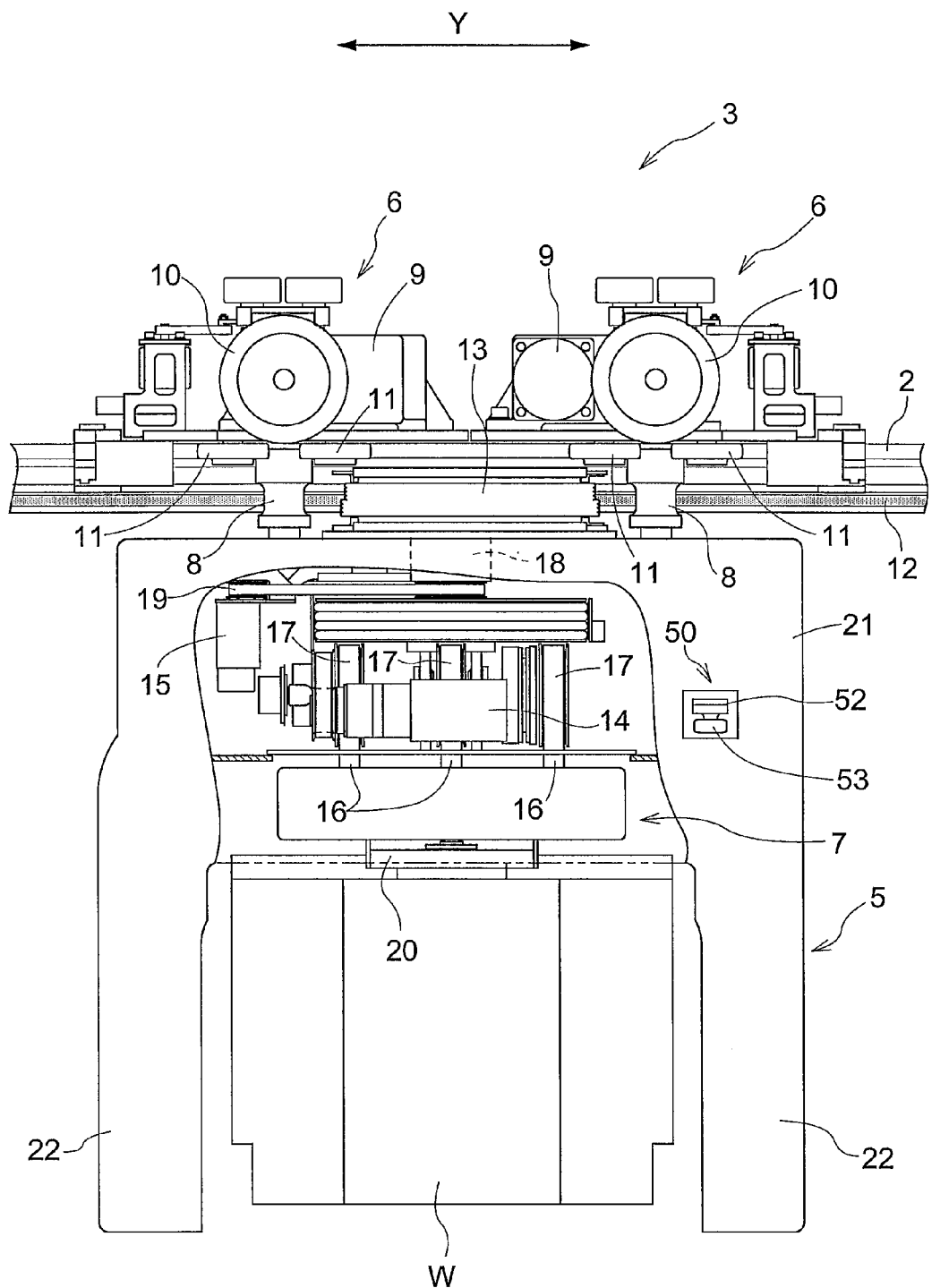
FIG. 2 is a side view of an article transporting vehicle.

As shown in FIG. 2, the article transport vehicle 3 has a vehicle main body portion 5, travel portions 6 for traveling on the travel rails 2, and a grip portion 7 (which corresponds to a holding portion) for gripping a container W with the container W being suspended therefrom. The travel portions 6 include a front and back pair of travel portions 6 which are spaced apart in a fore and aft direction of the article transport vehicle 3 with one travel portion 6 being located at a location corresponding to a forward end portion of the vehicle main body portion 5 and the other travel portion 6 being located at a location corresponding to a back end portion of the vehicle main body portion 5. Each of the front and back pair of travel portions 6 is connected to the vehicle main body portion 5 by a connecting shaft 8 such as to be rotatable about a vertical axis. The grip portion 7 is vertically movable with respect to the vehicle main body portion 5.

Each of the front and back pair of travel portions 6 includes travel wheels 10 each of which is driven and rotated by an electric drive motor 9 and which rolls on respective horizontally extending upper surfaces of right and left pair of travel rails 2, and freely rotatable guiding wheels 11 each of which is in contact with a corresponding one of vertically extending side faces—that face each other—of the right and left pair of travel rails 2. One travel wheel 10 is provided on each side in the lateral direction (the direction into and out of FIG. 2) of the article transport vehicle 3. And two guiding wheels 11 are provided on each side in the lateral direction such that the two guiding wheels 11 are located with one behind the other in the fore and aft direction of the article transport vehicle 3. And the travel portions 6 are configured to travel while guided by the travel rails 2 by the virtue of the fact that the travel wheels 10 are rotated about horizontal axes by the drive motor 9 and that the guiding wheels 11 which can rotate about vertical axes are in contact with the pair of travel rails 2 and are guided thereby in the horizontal direction.

Each of the front and back pair of travel portions 6 is connected to the vehicle main body portion 5 by the connecting shaft 8 such as to be rotatable about a vertical axis. Each connecting shaft 8 is located centrally of the gap between the right and left pair of travel rails 2 in the lateral direction of the article transport vehicle 3 and connects a central part of the travel portion 6 with a central part of the vehicle main body portion 5 with respect to the lateral direction of the article transport vehicle 3.

A power receiving portion 13 which is rectangular in plan view is located between the front and back pair of connecting shafts 8 in the fore and aft direction of the article transport vehicle 3. While illustration is omitted, the power receiving portion 13 is located in a central portion of the vehicle main body portion 5 with respect to the lateral direction of the article transport vehicle 3. And the cross section of the power receiving portion 13 as seen along the fore and aft direction of the article transport vehicle 3 has a shape having two horizontally extending straight portions that are spaced apart in the vertical direction as well as a vertically extending portion that connects each central part of these two horizontal portions together. And magnetic field is generated by running alternating current through a pair of electricity supply lines 12 provided along the pair of travel rails 2. The arrangement is configured to achieve contactless power supply with the power receiving portion 13 generating driving electric power from this magnetic field. Thus, with the driving electric power supplied from the electricity supply lines 12 to the power receiving portion 13 without contact, the article transport vehicle 3 allows, among other things, the travel portions 6 to travel and the grip portion 7 to be moved vertically using this driving electric power.

The vehicle main body portion 5 includes a frame member 21 having a downwardly opening bracket shape with a horizontal portion extending in the fore and aft direction of the article transport vehicle 3 and with vertical portions extending downwardly from a front end portion and from a back end portion of this horizontal portion. The grip portion 7 is located between the front and back pair of vertical frame members 22 defining the vertical portions of the frame member 21. And the vehicle main body portion 5 has an electric-powered vertical movement motor 14 for raising and lowering the grip portion 7, and the electric-powered turning motor 15 for rotating the grip portion 7 about a vertical axis.

The vertical movement motor 14 is configured to be capable of vertically moving the grip portion 7 between a raised position and a lowered position by spooling and feeding out belts 16 by drivingly rotating rotation drums 17 to which the belts 16 are spooled. It is possible to use, for example, wires in place of the belts. Although illustration is omitted, the raised position is a position close to the vehicle main body portion 5, and the lowered position is a position for transferring a container W to or from a container transfer station 1a associated with each of the processing device 1 installed on the floor surface.

Each station 1a consists of a support platform provided on the floor for receiving and supporting a container W. The station 1a is located in association with each of the plurality of processing devices 1, and is provided to receive a container W—to which a predetermined process is performed by the processing device—from the article transport vehicle 3, or to transfer a container W—to which a predetermined process has been performed by the processing device 1—to the article transport vehicle 3. The article transport vehicle 3 is configured to travel along the travel rails 2 with the grip portion 7 being located in the raised position, and to transfer (that is, to deliver or receive) the container W to or from the station 1a by raising and lowering the grip portion 7 between the raised position and the lowered position with the vehicle 3 stopped at a container transfer location corresponding to the station 1a that is a transfer destination among the plurality of stations 1a.

The grip portion 7 is connected to the vehicle main body portion 5 such as to be capable of rotating about a vertical axis by means of the rotating shaft 18 extending downwardly from an upper end of the vehicle main body portion. And the turning motor 15 is configured to be capable of rotating the grip portion 7 about the vertical axis by rotating the rotating shaft 18 about the vertical axis through a rotating power transfer portion 19 which includes a belt.

The grip portion 7 includes a gripper 20 for gripping a container W, and an electric-powered gripper motor (not shown) for switching the attitude of the gripper 20 between a gripping attitude for gripping a container W and a grip release attitude in which the grip is released. FIG. 2 shows the gripper 20 which is switched to its gripping attitude.

As shown in FIG. 1, container storage sections 4 are provided on one lateral side of and adjacent to the travel rails 2 to temporarily store containers W to be transported to stations 1a. And two or more container storage sections 4 are provided such that they are lined up close to each other along the travel rails 2.

The container storage sections 4 are described next with reference to FIGS. 3-7. Each of the plurality of container storage sections 4 includes a fixed frame member 29 provided to the ceiling or on the ceiling side so as to be fixed with respect to the ceiling, and a container support 28 for movement with respect to the fixed frame member 29 between a storage position for storing a container W and a transfer position for transferring a container W to or from the article transport vehicles 3.

The container support 28 is capable of being moved between a transfer position (see FIG. 7) for transferring a container, at which the container support 28 is projected toward the travel rails 2, and the storage position (see FIG. 6) at which the container support 28 is retrieved away from the travel rails 2, to receive a container W from the grip portion 7 of the article transport vehicle 3 stopped at the container transfer location for the container storage section 4 and to deliver a container W to the grip portion 7.

That is, the article transport vehicle 3 is capable of traveling along the travel rails 2 defining the travel path that extends by way of or adjacent to the container transfer locations for the container storage sections 4, and is a vehicle for transporting articles and having the grip portion 7 as a holding member for holding a container W. Thus, the article transport vehicle 3 functions as transporting means of the present invention.

In the description below, the direction in which the container support 28 is moved between the storage position and the transfer position, that is, the direction indicated by the arrow X in, for example, FIG. 1 will be referred to as the support moving direction and the lateral direction as seen along this support moving direction, that is, the direction indicated by the arrow Y in, for example, FIG. 1 will be referred to as the right and left direction.

As shown in FIGS. 3-7, the container support 28 is suspended from and supported to the fixed frame member 29—installed on the ceiling side (that is, supported by the ceiling) at a location corresponding to the storage position—by a slide guiding mechanism which defines means for supporting container support such that the upper end portion of the container support 28 can slide and move and such that the container support 28 can be moved or its positions can be changed between the storage position and the transfer position. And the container support 28 is configured to be capable of receiving and supporting a container W and to be capable of being moved with its central portion in the right and left direction being suspended and supported by the slide guiding mechanism.

The container transfer location is defined so as to correspond to each of the plurality of container storage sections 4. The width of the container support 28 in the right and left direction is sized to be less than the distance between the front and back pair of the vertical frame members 22 of the article transport vehicle 3. Therefore, with the article transport vehicle 3 stopped at the container transfer location, the container support 28 can be inserted between the front and back pair of the vertical frame members 22 of the article transport vehicle 3.

The storage position is set to be at a location away from where the travel rails 2 are in the support moving direction and adjacent to and to a side of the travel rails 2 such that the container support 28 and the container W supported by the container support 28 do not present obstacle to the movement of the article transport vehicle 3 or to the vertical movement of the grip portion 7 when the container support 28 is located in the storage position. The transfer position is set to be located at a position which overlaps—in the horizontal direction (that is, as seen along the vertical direction)—with the grip portion 7 of the article transport vehicle 3 which is stopped at the container transfer location, when the container support 28 is located in the transfer position, such that a container W can be transferred to or from the grip portion 7 located in a position close to the raised position with the article transport vehicle 3 stopped at the container transfer location.

The container support 28 includes a movable body 30 which is supported to the fixed frame member 29 for movement in the support moving direction and which is formed to have a shape which extends downwardly from the fixed frame member 29, and a support member 31 which extends from the lower end portion of the movable body 30 toward the travel rails 2 in the support moving direction.

The fixed frame member 29 spans between, and is suspended from and supported by, two support rail bodies 32, for supporting the fixed frame member, which are spaced apart from each other in the support moving direction. The fixed frame member 29 includes, as a suspending support 33, vertical wall portions 33a that extend upwardly from the fixed frame member 29 at each of one side and the other side in the support moving direction, and a horizontal connecting portion 33b which connects upper ends of the vertical wall portions 33a. Each of one end portion and the other end portion of the horizontal connecting portion 33b in the support moving direction is received by a receptacle support portion 32a formed in each of the pair of support rail bodies 32. The fixed frame member 29 is configured to be suspended from and supported by the pair of support rail bodies 32 provided to the ceiling by fastening the fixed frame member 29 with the fixed frame member 29 being received and supported by the receptacle support portion 32a in each of the pair of support rail bodies 32.

The movable body 30 includes a right and left pair of support arms 34 each of which is shaped to extend downwardly such that its lower portion has a narrower width than its upper portion in the support moving direction, an upper connecting member 35 which connects upper ends of the right and left pair of support arms 34, and an intermediate connecting member 36 which connects the portions—of the right and left pair of support arms 34—that extend downwardly from the upper end of the support arms 34.

Figure 4:
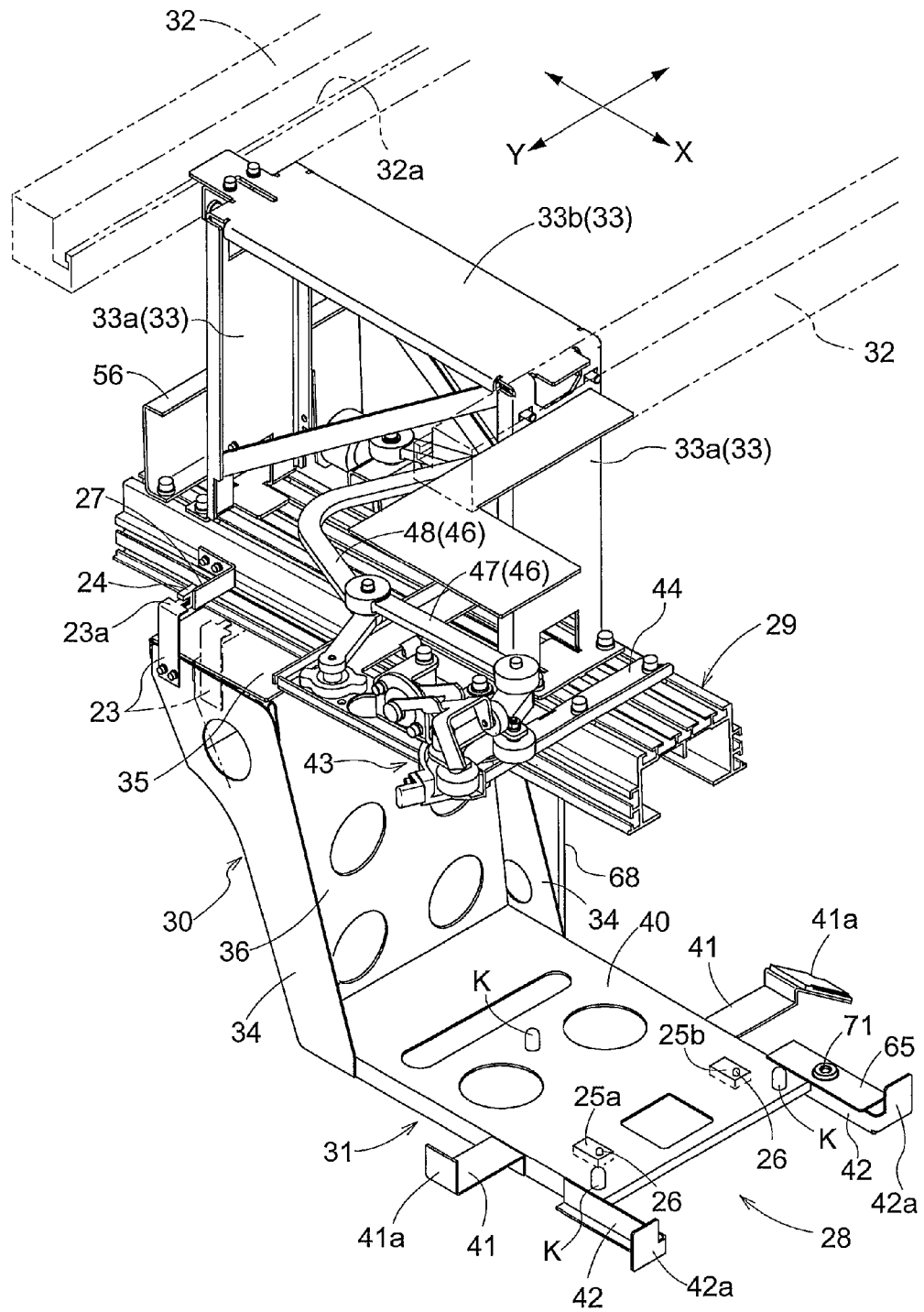
FIG. 4 is a perspective view of the container storage section.

As shown in FIG. 4, a detected member 23 for use in detecting the storage position is arranged vertically on one of the right and left pair of support arm 34. The detected member 23 comprises an L-shaped member which is bent toward the fixed frame member 29 so as to have a horizontal portion 23a having a convex shape (or a rectangular projection projecting horizontally from a central area of a flat base) in plan view at the top end of the detected member 23.

Figure 5:
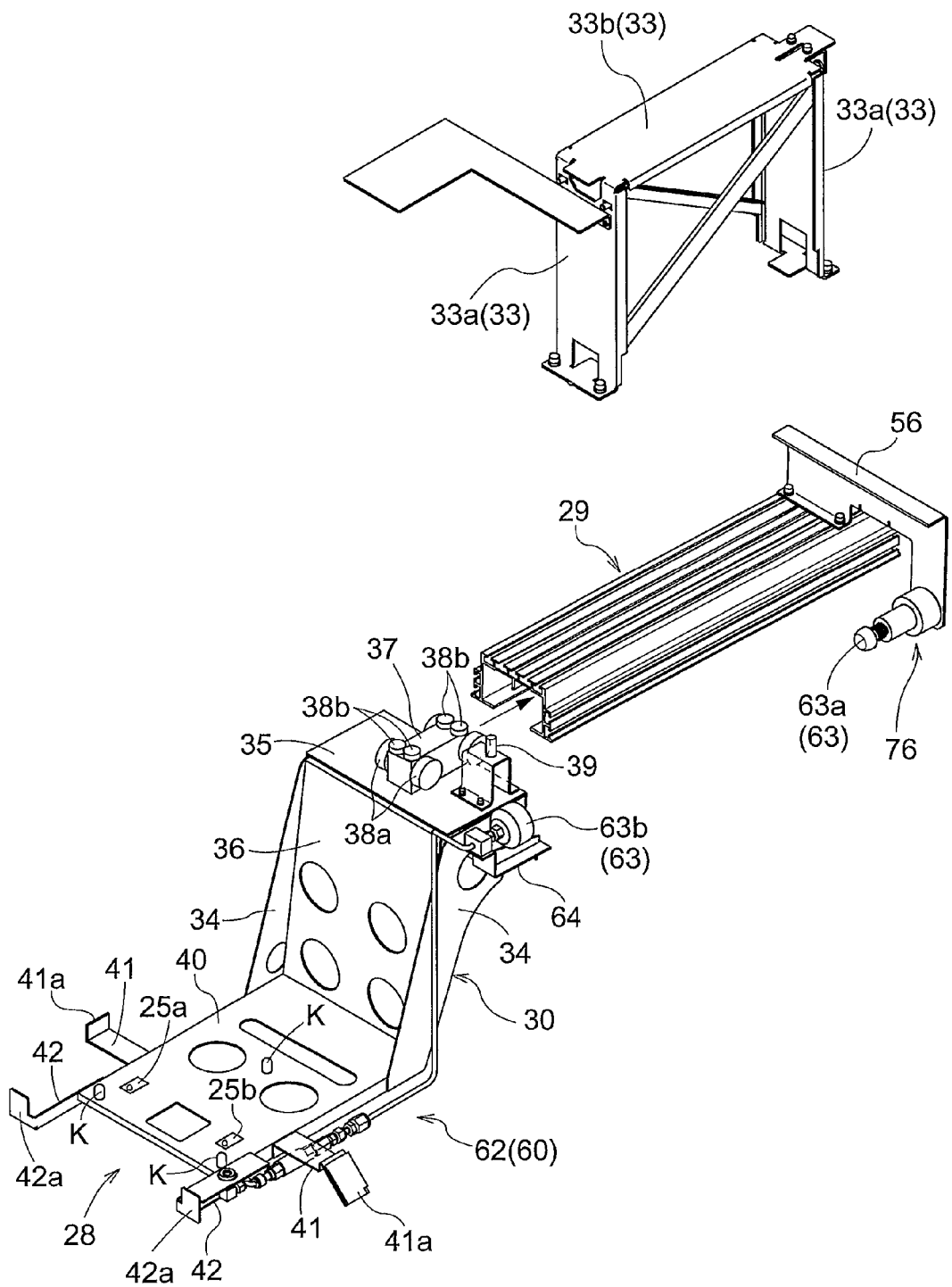
FIG. 5 is an exploded perspective view showing the support structure of the container support.

As shown in FIG. 5, a projection 37 which projects upwardly is provided in the central part of the upper connecting member 35 in the right and left direction. And a bar-shaped operated connection member 39 is arranged vertically on the upper surface of the upper connecting member 35 in its end portion in the right and left direction. The projection 37 includes, on its side faces, two sets of a right and left pair of first guide rollers 38a which are supported for rotation about a horizontal axis with the two sets being spaced apart in the support moving direction, and on its top face, two sets of a right and left pair of second guide rollers 38a which are supported for rotation about respective vertical axes with the two sets being spaced apart in the support moving direction.

Figure 3:
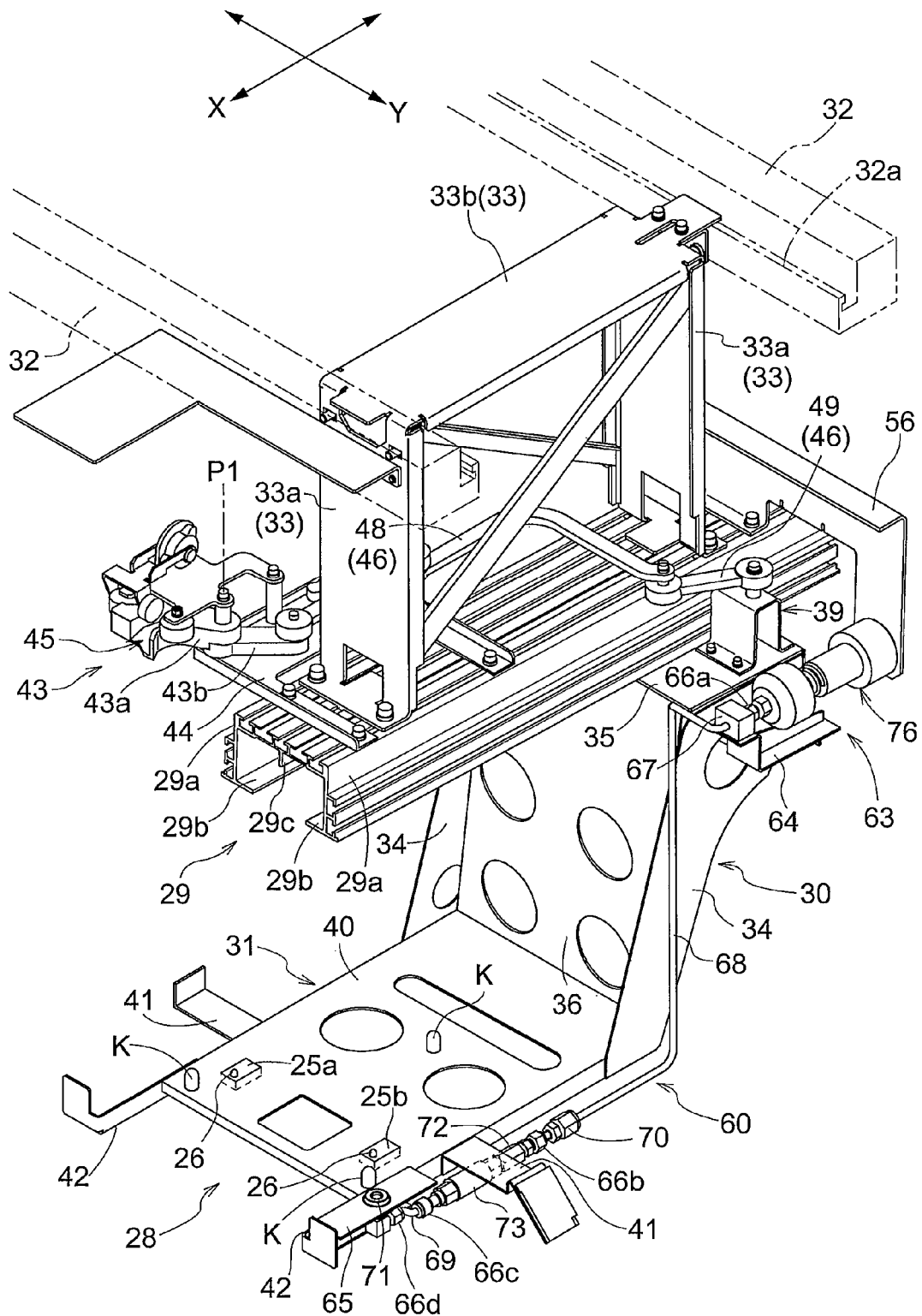
FIG. 3 is a perspective view of a container storage section.

The fixed frame member 29 is formed in a shape of a downwardly opening tube to allow the projection 37 of the movable body 30 to move in the support moving direction with the projection 37 of the movable body 30 being inserted into the fixed frame member 29. The bottom of the fixed frame member 29 is not open over the entire length thereof in the right and left direction, but instead, is open only in the central portion thereof. And as shown in FIG. 3, the bottom portions 29b that horizontally extend from the both side wall portions 29a are provided to the fixed frame member 29. The bottom portions 29b of the fixed frame member 29 are configured to guide the first guide rollers 38a—supported by the projection 37 inserted to within the fixed frame member 29—in the support moving direction. A guide rail portion 29c which projects downwardly and which extends along the support moving direction is provided in an upper portion of the fixed frame member 29. The guide rail portion 29c is configured to guide the second guide rollers 38b supported by the projection 37 inserted to within the fixed frame member 29 in the support moving direction. Thus, movable body 30 is supported to the fixed frame member 29 for sliding movement in the support moving direction.

Figure 6:
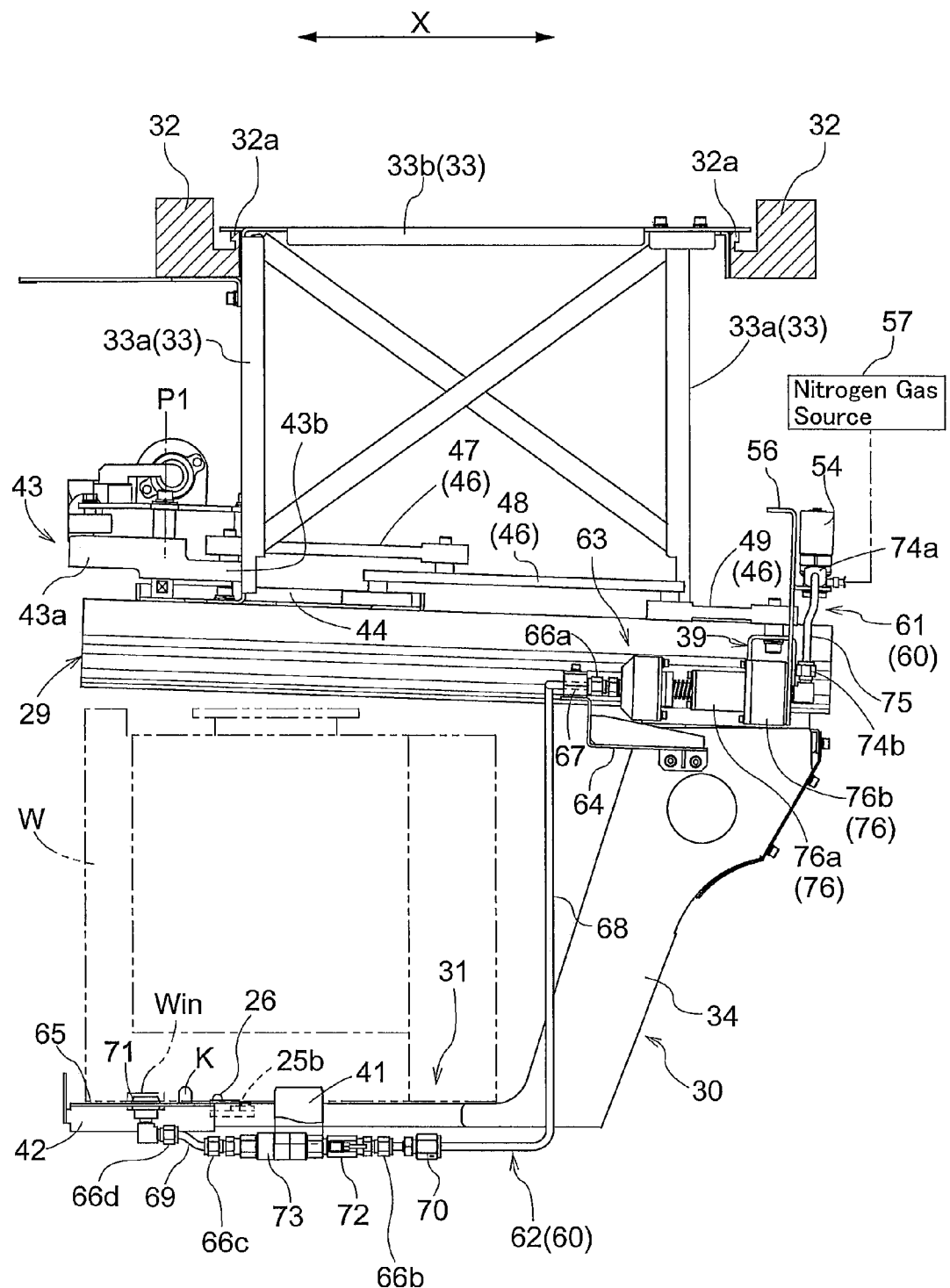
FIG. 6 is a side view of the container storage section when the container support is located in the storage position.
Figure 7:
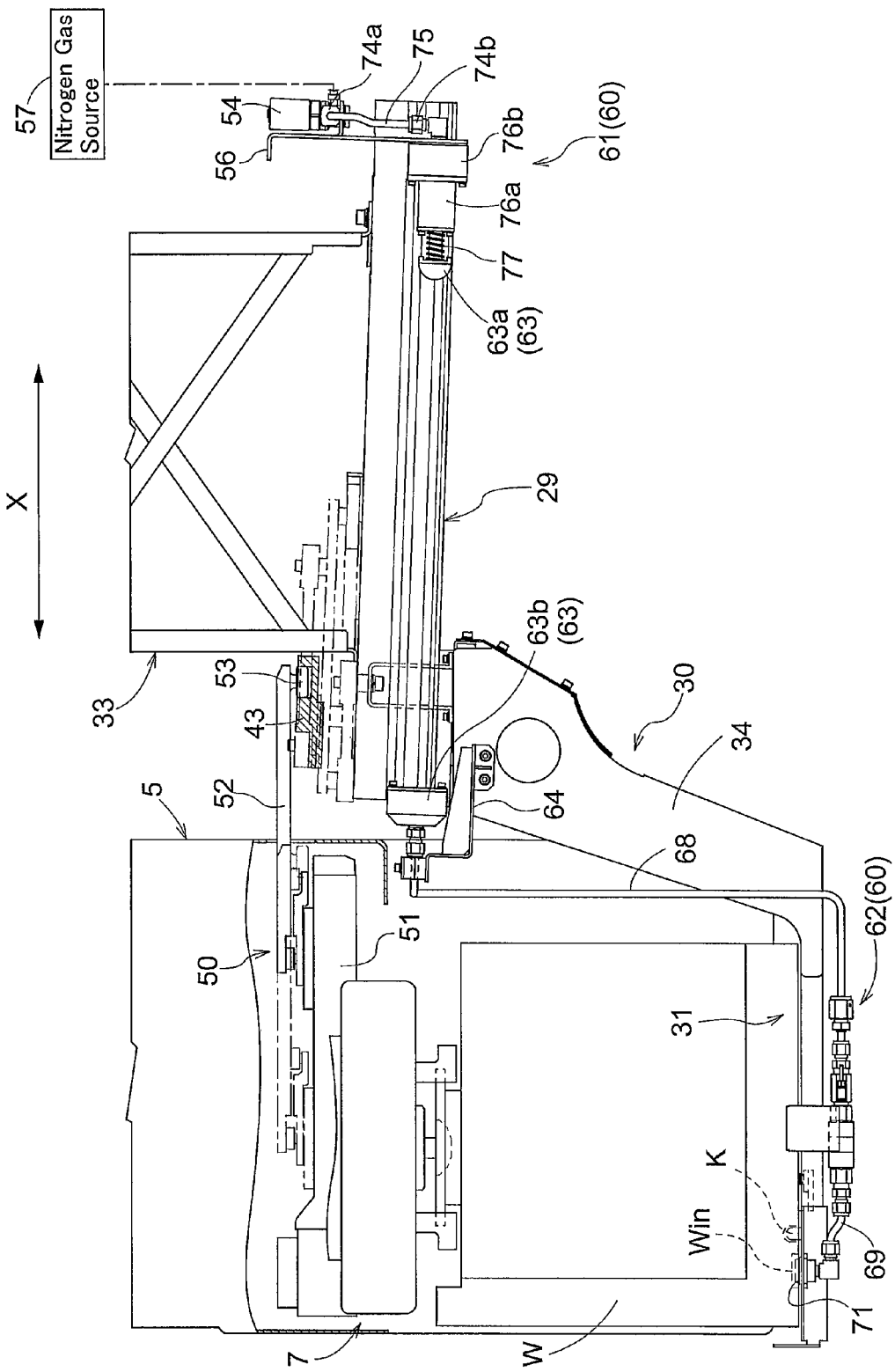
FIG. 7 is a side view of the container storage section when the container support is located in the transfer position.

As described above, the slide guiding mechanism (means for supporting the container support) comprises the bottom portions 29b of the fixed frame member 29 and the guide rail portion 29c as well as the projection 37 having the first guide rollers 38a and the second guide rollers 38b. Incidentally, as shown in FIGS. 6 and 7, the fixed frame member 29 is supported in such a tilted attitude that the container support 28 is located higher toward the transfer position to urge the container support 28 toward the storage position under its own weight.

The support member 31 includes a contact support portion 40 which has a width—in the right and left direction—which is smaller than that of the container W and which extends from the lower end portion of the movable body 30 toward the travel rails 2 in the support moving direction, and right-and-left movement restricting portions 41 which include vertical wall portions 41a (see FIG. 4) that extend along the right and left direction from the contact support portion 40 for contacting either side of the container W. Each right-and-left movement restricting portion 41 has a width—in the support moving direction—that is narrower than that of the container W. Two right and left movement restricting portions 41 are provided with one extending in one direction along the right and left direction from a central portion of the contact support portion 40 for the container W in the support moving direction and with the other extending the other direction along the right and left direction from the central portion of the contact support portion 40.

The contact support portion 40 includes fore-and-aft movement restricting portions 42 which include vertical wall portions 42a that extend along the support moving direction from the contact support portion 40 for contacting a side of the container W. Each fore-and-aft movement restricting portion 42 has a width—in the right and left direction—that is narrower than that of the contact support portion 40. The fore-and-aft movement restricting portions 42 are provided at both ends of the contact support portion 40 in the right and left direction. This allows the container W to be received and supported while restricting the movement of the container W in the support moving direction. A plurality of positioning pins K are provided in the contact support portion 40 to position the container W while it is supported. The positioning pins K are located at respective corners of a triangle in plan view.

A right and left pair of sensors consisting of a first seat sensor 25a and a second seat sensor 25b—that function as support state detection means for detecting the presence of the container W which is received and supported by the contact support portion 40—are attached to the contact support portion 40 at locations close to the positioning pins K that are located in the end of the contact support portion 40 closer to the transfer position in the support moving direction. Each of these seat sensors is provided with a push button 26 which is urged toward its projecting state. And the resting of the container W can be detected by the virtue of the fact that this push button 26 is pressed down by the bottom of the container W, resulting in the push button 26 blocking the detection light for the optical sensor installed within. Since each of the two seat sensor 25a and 25b separately located to the right and left detects the seating or resting of the container W when the container W is properly received and supported by the container support 28, it is detectable that the container W is properly received and supported by the container support 28 based on the detection state of the first seat sensor 25a and the second seat sensor 25b. These seat sensors are of conventional technology. And it is also possible to use any sensors that do not use an optical sensor.

The movable body 30 and the contact support portion 40 are continuous with each other in the support moving direction and are configured to have identical or approximately identical width in the right and left direction. The fixed frame member 29 is located at a laterally central part of the movable body 30 so as to allow the movable body 30 to be supported for well balanced and stable movement in the support moving direction. The fixed frame member 29 is located at such a location as to overlap—in the right and left direction and in the support moving direction—with the container support 28 in the storage position as viewed in the vertical direction, and has a width in the right and left direction which is narrower than that of the contact support portion 40. That is, as seen in the moving direction of the container support 28, the dimension of the fixed frame member 29 in the right and left direction is formed to be smaller than that of the container support 28 in the same direction.

The fixed frame member 29 has an operated member 43 which is provided on one side of the fixed frame member 29 in the right and left direction, and which is supported for movement in the support moving direction between a proximate position (see FIGS. 3 and 6) closer to the article transport vehicle 3 stopped at the container transfer location, and a spaced apart position (see FIG. 7) spaced apart from the article transport vehicle 3 stopped at the container transfer location. The operated member 43 is operatively connected to the slide guiding mechanism described above such that operated member 43 causes the container support 28 to be moved to the storage position when the operated member 43 is moved to the proximate position, and the container support 28 to be moved to the transfer position when the operated member 43 is moved to the spaced apart position.

As shown in FIG. 3, the longitudinally central portion of the operated member 43 is pivotably connected to a bracket-shaped base 44 provided in the upper portion of the fixed frame member 29 such that the operated member 43 is pivotable about a first pivot axis P1 which is where the member 43 is connected to the base 44. The operated member 43 is integrally formed to have the first operated portion 43a extending from the first pivot axis P1 toward the article transport vehicle 3, and the second operated portion 43b extending from the first pivot axis P1 and away from the article transport vehicle 3 when the operated member 43 is in its proximate position. The first operated portion 43a and the second operated portion 43b are vertically displaced with each other to form a step therebetween.

The operated member 43 can be switched between the proximate position and the spaced apart position by pivoting about the first pivot axis P1 and is configured in the proximate position to assume an attitude in which it is closer to the article transport vehicle 3 stopped at the container transfer location than the first pivot axis P1. The first operated portion 43a of the operated member 43 has a groove 45 that extends in a direction that intersects the support moving direction toward the first pivot axis P1 when the operated member 43 is in the proximate position. This groove 45 has a distal end closer to the article transport vehicle 3 stopped at the container transfer location with the distal end formed to have a shape that opens along the support moving direction.

A linkage mechanism 46 for linking the movement of the operated member 43 to the movement of the container support 28 is provided such that, when the operated member 43 is in the proximate position, the article support 14 is caused to be located in the storage position as shown in FIG. 6, and that when the operated member 43 is in the spaced apart position, the article support 14 is caused to be located in the transfer position as shown in FIG. 7.

As shown in FIGS. 3, 4, and 6, the linkage mechanism 46 includes three link arms, which are pivotable about vertical axes, including a first link arm 47, a second link arm 48, and a third link arm 49. The first link arm 47 has one end portion pivotably connected to one end portion of the second operation portion 43b of the operated member 43, and has the other end portion pivotably connected to a longitudinally intermediate portion of the second link arm 48. The second link arm 48 has one end portion pivotably connected to the base 44, and has the other end portion pivotably connected to one end portion of the third link arm 49. The third link arm 49 has the other end portion pivotably connected to the operated connection member 39 arranged vertically on the fixed frame member 29.

Mounted on the one side (side on which the operated member 43 is provided) of the fixed frame member 29 in the right and left direction is a storage position detection sensor 24 (see FIG. 4) that functions as storage position detection means for detecting that the container support 28 is at the storage position, and that is mounted with a sensor attachment bracket 27 provided to extend from the one side of the fixed frame member 29 in the right and left direction. The storage position detection sensor 24 includes a photomicrosensor having light emitting and receiving portions located at a pair of opposed free ends of a bracket shaped member with the opposed free ends being arranged vertically. The relative height of the detected member 23 with respect to the storage position detection sensor 24 is adjusted such that the horizontal convex-shaped portion 23a (as seen in plan view) of the detected member 23 comes to be located at a vertically intermediate height between the pair of opposed fee ends.

Figure 9:
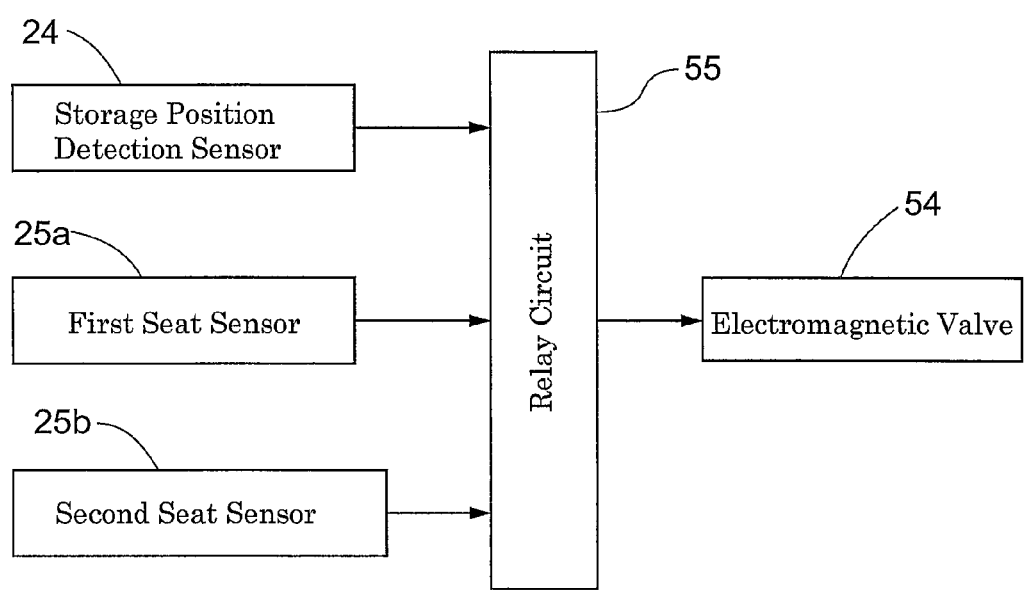
FIG. 9 is a block diagram showing inputs and outputs into and from the relay circuit.

As shown in FIG. 9, the above-described first seat sensor 25a, the second seat sensor 25b, and the storage position detection sensor 24 are connected to a relay circuit 55 which controls opening and closing of an electromagnetic valve 54. The electromagnetic valve 54 and the relay circuit 55 are affixed to the back side of a mounting panel 56 attached to the end of the fixed frame member 29 close to the retracted position in the support moving direction. Incidentally, the signal wires of the first seat sensor 25a and the second seat sensor 25b are housed within a wire guide (not shown), and are prevented from breaking or otherwise being damaged by the virtue of the fact that they are extended along a suitable wiring path appropriate to accommodate movement of the container support 28.

As shown in FIGS. 2 and 7, operating means 50 for changing the position of the container support 28 between the storage position and the transfer position is provided to the article transport vehicle 3. As shown in FIG. 2, the operating means 50 is provided to one side—in the right and left direction—of the vehicle main body portion 5 of the article transport vehicle 3, and includes, as shown in FIG. 7, a base 51 which is fixed to the article transport vehicle 3 and which is long in the support moving direction, a long operating member 52 which is movable in the support moving direction with respect to the base 51, and an engaging roller 53 provided to the undersurface of the distal end portion of the operating member 52. The operating means 50 is configured to cause the operating member 52 to be projected and retracted with respect to the base 51 by the action of the actuator (not shown) to perform a projecting operation and retracted operation in which the engaging roller 53 is moved in the support moving direction.

The engaging roller 53 is formed to have a diameter that is either identical to or smaller than the width of the groove 45 of the operated member 43 in the right and left direction. This allows the engaging roller 53 to be moved into and out of engagement with the groove 45 of the operated member 43. The operating means 50 is configured to be of a push-pull type that causes the engaging roller 53 to engage the groove 45 by an projecting operation to push the operated member 43 from the proximate position to the spaced apart position, and that causes the engaging roller 53 to engage the groove 45 by an retracting operation to pull the operated member 43 from the spaced apart position to the proximate position, and then to cause the engaging roller 53 to be released from the groove 45.

As shown in FIGS. 3, 6, and 7, provided to the container storage section 4 is gas supply means 60 for supplying nitrogen gas, as an example of inert gas, through a gas supply line to the container W received and supported by the container support 28 located at the storage position.

The gas supply means 60 includes a fixed side portion 61 which is provided to the fixed frame member 29 side and which is connected to a gas supply source 57 (FIG. 6), and a moving side portion 62 provided to the container support 28 side. The connecting member 63 is provided that connects together the fixed side portion 61 and the moving side portion 62 as the container support 28 is moved from the transfer position to the storage position as shown in FIG. 6, and that releases or severs the connection between the fixed side portion 61 and the moving side portion 62 as the container support 28 is moved from the storage position to the transfer position as shown in FIG. 7 to allow the moving side portion 62 to move away from the fixed side portion 61.

Figure 8:
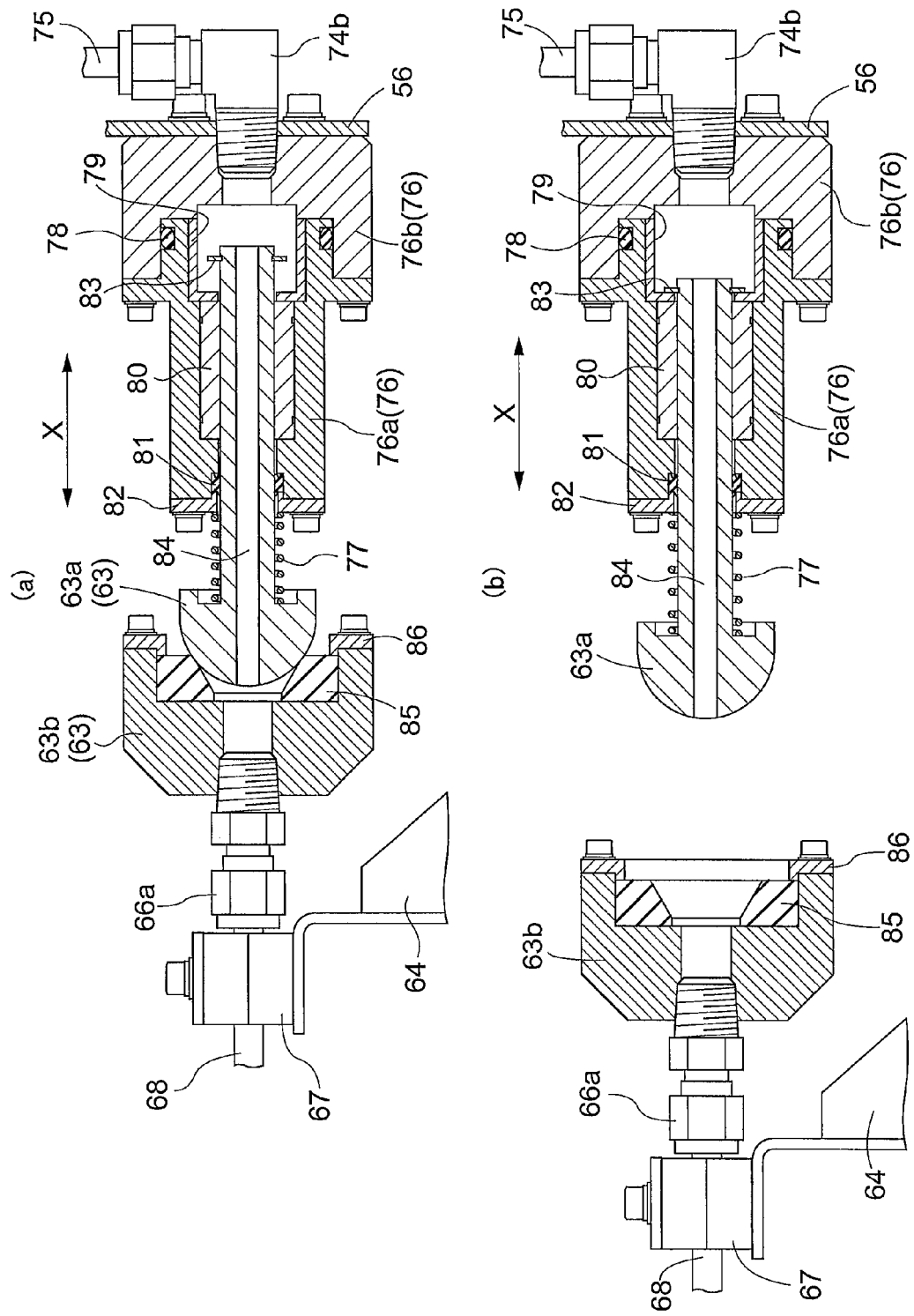
FIG. 8 is a longitudinal sectional side view of a connecting member.

As shown in FIG. 8, the connecting member 63 includes a movable nozzle 63a which is provided to the fixed side portion 61 and which can be projected and retracted in the direction of the movement of the container support 28 between the storage position and the transfer position, and which is urged toward the projected side by urging means. The connecting member 63 also includes a recessed portion 63b which is provided to the moving side portion 62, and which the movable nozzle 63a can be inserted into and moved out of.

As shown in FIGS. 3, 6, and 7, the moving side portion 62 of the gas supply means 60 includes the following parts connected in series along the direction in which the gas flows: a moving side first stainless steel pipe 68 which has a moving side first joint portion 66a at one end and a moving side second joint portion 66b at the other end and which is bent at a plurality of locations; a moving side second stainless steel pipe 69 which has a moving side third joint portion 66c at one end and a moving side fourth joint portion 66d at the other end and which is bent at two locations; a pressure sensor connecting portion 72 located between the moving side first and second stainless steel pipes 68, 69, and a filter 73a. A pressure sensor can be attached to the pressure sensor connecting portion 72 and thereby the supply pressure of nitrogen gas can be monitored by a pressure sensor controller (not shown) provided on the mounting panel 56.

The recessed portion 63b is connected to the upstream side of the moving side first joint portion 66a in the upstream side end of the moving side first stainless steel pipe 68, and an orifice 70 is interposed on the upstream side of the moving side second joint portion 66b in the downstream side end. A nozzle cap 71 having an opening-and-closing valve which is urged toward its closed position is connected to the downstream side of the moving side fourth joint portion 66d in the downstream side end of the moving side second stainless steel pipe 69.

The moving side portion 62 is located adjacent to and to a lateral side of the container support 28 on the other side in the right and left direction (i.e. on the side opposite from where the detected member 23 and the operated member 43 are located) as seen in the direction of the movement of the container support 28, by virtue of the fact that the downstream side portion of the moving side first joint portion 66a is elastically supported by a urethane block 67 provided to the moving side upstream bracket 64 and that the nozzle cap 71 is supported by a plate-shaped nozzle mounting plate 65. The recessed portion 63b is moved along the support moving direction in an area adjacent to and to a lateral side of the fixed frame member 29 as the container support 28 is moved between the storage position and the transfer position. To describe in more detail, the moving side upstream bracket 64 is fixed to the other—with respect to the container support 28—of the right and left pair of support arms 34 (i.e. the one on the side opposite from where the detected member 23 and the operated member 43 are located), and elastically supports the upstream side end of the moving side portion 62 by clamping the end of the moving side first stainless steel pipe 68 between two layers of urethane blocks 67 arranged vertically and provided to the moving side upstream bracket 64. On the other hand, the nozzle mounting plate 65 is arranged to extend horizontally from a portion—on the other side with respect to the container support 28—of the distal end portion of the contact support portion 40 of the support member 31 to the one—located on the other side with respect to the container support 28—of the right and left pair of the fore and aft movement restricting portions 42. A circular opening for mounting the nozzle is formed in the nozzle mounting plate 65. And the nozzle cap 71 which is circular in plan view is fixed to this opening such that the center of the nozzle cap coincides with the center of the opening.

When the container W is placed on the support member 31 of the container support 28, the nozzle cap 71 and a supply port Win provided in the bottom of the container W fits into each other and the nozzle cap 71 pushes upward an opening-and-closing valve in the supply port Win which is urged toward its closed position while the opening-and-closing valve in the nozzle cap 71 which is urged toward its closed position is depressed by the supply port Win. This allows the interior of the container W to be in communication with a flow path for nitrogen gas in the moving side portion 62 of the gas supply means 60. In addition, an exhaust port having an opening-and-closing valve which is urged toward its closed position is formed in the bottom of the container W. And when the internal pressure of the container W is increased by the supply of the nitrogen gas, the opening-and-closing valve of the exhaust port opens to an extent that corresponds to the internal pressure, thus releasing the gas from within the container W. Thus, the container W can be filled with nitrogen gas by supplying the nitrogen gas through the supply port Win while maintaining the pressure inside the container W constant.

As shown in FIGS. 3, 6, and 7, the fixed side portion 61 of the gas supply means 60 includes the following parts connected in series along the direction in which the gas flows: a stainless steel pipe connected to the gas supply source 57; an electromagnetic valve 54 which is connected to this stainless steel pipe and which is attached to the back of the mounting panel 56; a fixed side stainless steel pipe 75 having one end connected to a fixed side first joint portion 74a connected to the electromagnetic valve 54 and having the other end connected to a fixed side second joint portion 74b connected to a housing 76; and a movable nozzle 63a which is inserted into the housing 76 and can be projected toward a projected side and retracted toward a retracted side in the support moving direction, and which is urged toward a projected side by a coiled spring 77 (urging means). Although the housing 76 is attached to the front of the mounting panel 56, since the fixed side joint portion 74b extends through an opening formed in the mounting panel 56, and a fixed side gas flow path in the fixed side portion 61 is formed to extend from the back side to the front side of the mounting panel 56. The movable nozzle 63a is located on the front side of the mounting panel 56 and is located adjacent to and to a side—in the right and left direction—of the fixed frame 29.

Having thus configured, the connecting member 63 of the gas supply means 60 is located on the other side of the fixed frame member 29 in the right and left direction as seen in the direction in which the container support 28 is moved (i.e. on the side opposite from where the storage position detection sensor 24 and the operated member 43 are located). Installation of the gas supply means 60 is facilitated and the space near the ceiling is used effectively by locating the storage position detection sensor 24 and the operated member 43 on one side of the fixed frame member 29 in the right and left direction, by locating the connecting member 63 on the other side of the fixed frame member 29 in the right and left direction, and further by locating the moving side portion 62 of the gas supply means 60 on the other side of the container support 28 in the right and left direction as seen in the direction in which the container support 28 is moved such that the moving side portion 62 is adjacent to the container support 28.

As shown in FIG. 8, the movable nozzle 63a is configured to include a straight rod portion located on the retrieved side and a dome-shaped head portion located in the end on the projected side. An internal flow path 84 is formed within the movable nozzle 63a from the back end of the rod portion to the distal end of the head portion to communicate the fixed side gas flow path in the fixed side portion 61 with the moving side gas flow path in the moving side portion 62 to allow the nitrogen gas to flow along the direction in which the container support 28 is moved when the movable nozzle 63a is inserted into the recessed portion 63b.

In the present embodiment, the internal flow path 84 is defined by a straight flow path which extends through the interior of the movable nozzle 63a in the direction in which the container support 28 is moved. As such, since the flow resistance of the nitrogen gas in the flow path in the movable nozzle 63a is small, the nitrogen gas can flow smoothly inside of the movable nozzle 63a.

The housing 76 includes a nozzle support housing 76a which includes a linear bushing 80 and which supports the movable nozzle 63a such that the movable nozzle 63a can be projected and retracted, and a base housing 76b which is fixedly attached to the mounting panel 56 with the nozzle support housing 76a being fit into the base housing 76b while sealing therebetween by an O ring 78 fit onto the peripheral portion of the retrieved position side end of the nozzle support housing 76. The flow path of the fixed side second joint portion 74b and the internal flow path 84 of the movable nozzle 63a are in communication with a space formed within the housing 76. Thus, a fixed side gas flow path is formed from the gas supply source 57 to the distal end of the movable nozzle 63a through the electromagnetic valve 54 and the fixed side stainless steel pipe 75.

A ring-shaped gasket 81 for sealing the gap between the movable nozzle 63a and the nozzle support housing 76 is fit onto a projected side end of the nozzle support housing 76 so that the movable nozzle 63a inserted in the linear bush 80 can be projected and retracted while maintaining the airtight state. The retaining flange 82 for preventing the gasket 81 from falling off is attached to the outermost end on the projected side of the nozzle support housing 76. A cylindrical collar 79 having a flange portion which extends toward the center at the projected side end is provided at the end on the retrieved position side of the nozzle support housing 76. The inside diameter of the flange portion is greater than but approximately equal to the outer dimension of the rod portion of the movable nozzle 63a. A C-shaped retaining ring 83 which is fit onto the peripheral portion of the retrieved side end of the movable nozzle 63a abuts against the flange portion of the collar 79 to restrict the limit position of the movable nozzle 63a on the projected side.

A ring-shaped urethane block 85 having an inner peripheral surface which is tapered such that its inner radius decreases toward the deeper end in an inserting direction (the support moving direction) is inserted and fit into the side of the recessed portion 63b which faces the movable nozzle 63a. And a retaining flange 86 that contacts the periphery portion of the urethane block 85 is attached to the side of the recessed portion 63b which faces the movable nozzle 63a. The ring-shaped urethane block 85 functions as a sealing member for sealing any gap between the recessed portion 63b and the dome-shaped distal end portion of the movable nozzle 63a when the movable nozzle 63a is inserted to the recessed portion 63b.

Provided to the article transport vehicle 3A is a carriage side controller which controls operations of the article transport vehicle 3 by controlling, among other things, travel operation of the travel portions 6, vertical movement operation of the grip portion 7, and attitude switching operation of the gripper 20. And when the carriage side controller receives a transport command which specifies the transport origin and the transport destination from a facility management computer which manages operations of a plurality of article transport vehicles 3, the carriage side controller is configured to perform a transporting process in which a container W is transported from the transport origin to the transport destination specified in the transport command. The station 1a or the container storage section 4 is specified as the transport origin or the transport destination. Here, the controller and the computer are of the conventional technology, and have a CPU, memory, communication unit, etc. And algorithms for executing the functions described in this specification are stored in the memory.

When the carriage side controller receives a transport command which specifies a station 1a as the transport origin, and which specifies a container storage section 4 as the transport destination, the carriage side controller controls the operation of the article transport vehicle 3 by controlling the travel operation of the travel portions 6 to cause it travel to the specified station 1a of the transport origin based on detected information from various sensors, such as a sensor for detecting the target stop position corresponding to the station 1a of the transport origin, and a sensor for detecting the distance covered from a reference point by the article transport vehicle 3, and thereafter by controlling the vertical movement operation of the grip portion 7 and the attitude switching operation of the gripper 20 to receive a container W from the station 1a of transport origin. The carriage side controller then controls the travel of the article transport vehicle 3 to cause it to travel to the container storage section 4 of the specified transport destination based on the detected information from various sensors.

When the article transport vehicle 3 arrives at the container transfer location corresponding to the container storage section 4 of the transport destination, the carriage side controller controls the projecting and retracting operation of the operating means 50 as well as the attitude switching operation of the gripper 20, with the article transport vehicle 3 stopped, to project the operating means 50 to push the operated member 43 of the container storage section 4 from the proximate position to the spaced apart position and thus to move the container support 28 located in the storage position to the transfer position, and then to place the container W on the container support 28. And the carriage side controller causes the operating means 50 to be retracted to pull the operated member 43 in the container storage section 4 from the spaced apart position to the proximate position to move the container support base 28 located in the transfer position to the storage position.

As the article transport vehicle 3 moves the container support 28 from the storage position to the transfer position, the movable nozzle 63a and the recessed portion 63b which define the connecting member 63 are moved apart from each other (see FIG. 8 (b)), which causes the moving side portion 62 to move away from the fixed side portion 61 of the gas supply means 60, resulting in a release of the connection between the fixed side portion 61 of the gas supply means 60 and the moving side portion 62. And as the article transport vehicle 3 moves the container support 28 from the transfer position to the storage position, the movable nozzle 63a and the recessed portion 63b which define the connecting member 63 become connected to each other (see FIG. 8 (a)), which causes the moving side portion 62 and the fixed side portion 61 of the gas supply means 60 to be connected to each other, resulting in establishing communication between the fixed side gas flow path in the fixed side portion 61 and the moving side gas flow path in the moving side portion 62.

A relay circuit 55 that functions as inert gas supply control means is provided in the container support 28 (see FIG. 9). The relay circuit 55 causes the electromagnetic valve 54 to be opened when relay circuit 55 receives a detection signal that shows that the container W is received and supported by the container support 28 from both the first seat sensor 25a and the second seat sensor 25b, and a storage position signal that shows that the container support 28 is located in the storage position from the storage position detection sensor 24. In the container storage section 4 in which no container W is stored, although the storage position signal will be sent from the storage position detection sensor 24 if the container support 28 is the storage position, the first seat sensor 25a and the second seat sensor 25b will send no detection signals; thus, the electromagnetic valve 54 in the container storage section 4 stays closed. For this reason, even if the fixed side gas flow path in the fixed side portion 61 and the moving side gas flow path in the moving side portion 62 are in communication with each other because the container support 28 is located in the storage position, there will be no flow of nitrogen gas; thus, no nitrogen gas will be released from the nozzle cap 71.

Although detailed description of the relay circuit 55 is omitted, it can be configured, for example, by connecting in series three relay outputs which take the output from each sensor as the input to control the opening and closing of the power supply line to the electromagnetic valve 5.

Thus, the relay circuit 55 allows nitrogen gas to be supplied by the gas supply means 60 when the container support 28 is located in the storage position and the container W is supported by the container support 28 based on the detected information from the first seat sensor 25a, the second seat sensor 25b, and the storage position detection sensor 24, and prevents the nitrogen gas from being supplied by the gas supply means 60 when the container support 28 is not located in the storage position or when the container W is not supported by the container support 28.

With the configuration described above, when a container W is transported to the container storage section 4 by the article transport vehicle 3, nitrogen gas can be supplied to the container W to fill the inside of Container W with the nitrogen gas at a predetermined pressure while storing the container W in the container storage section 4. Further, the relay circuit 55 controls the opening and closing of the electromagnetic valve 54 based on the detected information from the first seat sensor 25a, the second seat sensor 25b, and the storage position detection sensor 24; thus, useless discharge of the nitrogen gas can be prevented.

[Alternative Embodiments]

While the present invention is specifically described based on the embodiments of the invention, the present invention is not limited to the above-described embodiments, to which various changes can be made without deviating from the spirit of the invention. The alternate embodiments of the present invention are described next.

Figure 10:
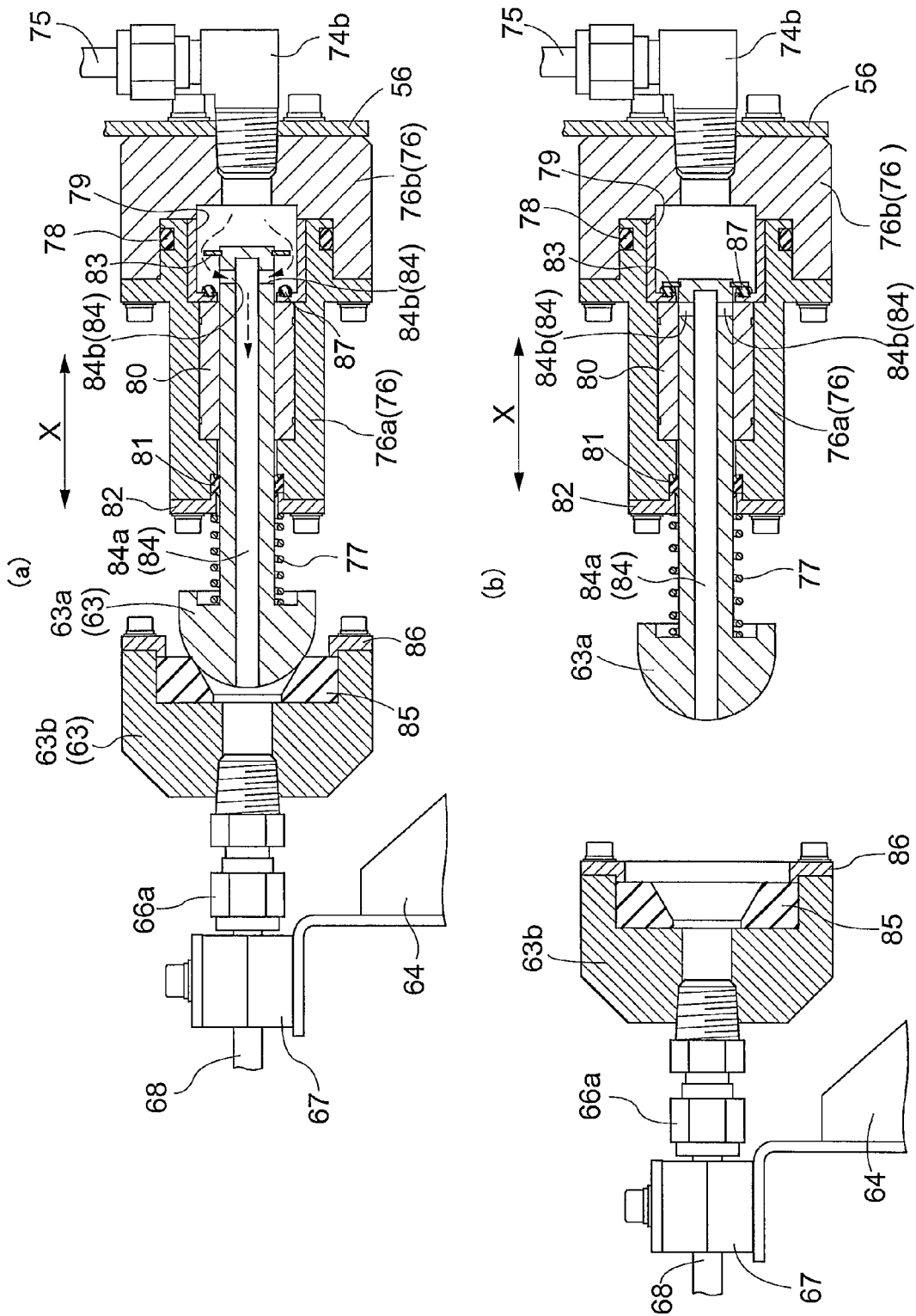
FIG. 10 is a longitudinal sectional side view of a connecting member in accordance with another embodiment.

(1) In the embodiment described above, although the movable nozzle is described as having an internal flow path that is defined as a straight flow path that extends through the interior of the movable nozzle in the direction in which the container support is moved, an internal flow path of the movable nozzle may have various configurations. For example, as shown in FIG. 3, the internal flow path 84 may be configured to include a straight first flow path portion 84a that extends from the projected side end—in the direction in which the container support 28 is moved (i.e., the direction shown at X in FIG. 10)—of the movable nozzle 63a to a location just before the retrieved side end, and a second flow path portion 84b which communicates the first flow path portion 84a with the exterior of the movable nozzle 63a in the radial direction of the movable nozzle 63a at a location on the retrieved side of the movable nozzle 63a.

In this case, the position of the second flow path portion 84b in the support moving direction is preferably set at a position at which the second flow path portion 84b overlaps with the physical extent of the linear bush 80 when the movable nozzle 63a is located at the limit position on the projected side. With this configuration, blocking and opening means can be formed for blocking the second flow path portion 84b when the container support 28 is located at the transfer position (position shown in FIG. 7), and for opening the second flow path portion 84b when the container support 28 is located at the storage position (position shown in FIG. 6). And a ring-shaped O ring 87 which consists of an elastic material, such as urethane, is provided in the flange portion of the collar 79 to improve sealing effect when the second flow path portion 84b is blocked.

As the container support 28 is moved from the storage position to the transfer position, the recessed portion 63b is moved away from the movable nozzle 63a along the support moving direction, and the movable nozzle 63a which is urged toward the projected side by the coiled spring 77 is moved to the projected side along the support moving direction. Thus, by virtue of the fact that the C-shaped retaining ring 83 provided in the retrieved position side end of the movable nozzle 63a abuts against the O-ring 87 provided to the collar 79, the movement to the projected side of the movable nozzle 63a is restricted and the second flow path portion 84b and the interior space of the housing 76 can be isolated and sealed from each other.

In addition, when the O-ring 87 is provided, the location of the second flow path portion 84b in the support moving direction may be located more toward the retrieved position side than the physical extent of the linear bush 80 in the support moving direction when the movable nozzle 63b is located at the limit position on the projected side. In this case, the retaining ring 83 may comprise a ring-shaped O-ring. Thus configured, the blocking and opening means would consist of the retaining ring 83 and the O-ring 87.

Thus, by providing the blocking and opening means, external air can be prevented, to the extent possible, from entering the interior of the housing 76 from the distal end portion of the movable nozzle 63a when the container support 28 is moved from the storage position to the transfer position to transfer a container W.

(2) In the embodiment described above, although the container storage section 4 is provided to one lateral side of the travel rails 2 as an example, it is also possible to install the container storage sections 4 to both lateral sides of the travel rails 2. And, although a plurality of container storage sections 4 are provided to be arranged in a row along the travel rails 2, the number of the installed container supports 28 can be appropriately changed.

When the container storage sections 4 are installed to both lateral sides of the travel rails 2, the article transport vehicle 3 may have two operating means 50 including one operating means 50 for performing the change operation of the container support 28 located to one side with respect to the travel direction, and the other operating means 50 for performing the change operation of the container support 28 located to the other side with respect to the travel direction of the article transport vehicle 3.

In addition, the article transport vehicle 3 may have only one operating means by providing the operating means 50 with an engaging roller that can be projected and retrieved to both right and left with respect to the travel direction of the article transport vehicle 3.

(3) In the embodiment described above, although the container storage sections 4 are provided on the ceiling side, as an example, the invention is not limited to this. And, for example, the container storage sections 4 may be installed on the floor surface. The transporting means is not limited only to the article transport vehicle 3 as illustrated as an example and instead may be any device that is configured to transport a container that holds substrates and to transfer the container to and from a container support located in the transfer position.

(4) In the embodiment described above, the container storage section includes, as an example, the operated member which is pushed and pulled between the proximate position and the spaced apart position by the operating means which is provided to the vehicle as transporting means, and the support means for container support which is operatively connected to the operated member wherein the container support is moved between the storage position and the transfer position as the operating portion is pushed and pulled by the operating means of the vehicle. However, instead, move actuating means for moving the container support may be provided to the container storage section so that the move actuating means can be operated, with the vehicle stopped in the container transfer location, to move the container support between the storage position and the transfer position.

What is claimed is:

1. A container storage facility comprising:
   transporting means for transporting a container for holding at least one substrate;
   a container storage section for storing the container transported by the transporting means;
   wherein the container storage section includes a fixed frame member fixedly provided and a container support provided to be movable with respect to the fixed frame member between a storage position for storing the container and a transfer position for transferring the container to or from the transporting means,
   gas supply means for supplying inert gas, through a gas supply line, to the container supported by the container support located at the storage position is provided, wherein the gas supply line includes a fixed side portion provided to the fixed frame member, a moving side portion provided to the container support so as to be movable in unison with the container support, and a connecting member for connecting the fixed side portion and the moving side portion to each other as the container support is moved from the transfer position to the storage position, and for releasing the connection between the fixed side portion and the moving side portion to allow the moving side portion to move away from the fixed side portion as the container support is moved from the storage position to the transfer position.

2. A container storage facility as defined in claim 1 further comprising:
   a storage position detection means for detecting that the container support is located at the storage position;
   a support state detection means for detecting that the container is supported by the container support;
   inert gas supply control means for, based on detected information from the storage position detection means and the support state detection means, allowing the inert gas to be supplied by the gas supply line when the container support is located in the storage position and the container is supported by the container support, and for preventing the inert gas to he supplied by the gas supply line when the container support is not located in the storage position or when the container is not supported by the container support.

3. A container storage facility as defined in claim 1, wherein
   the connecting member includes:
   a movable nozzle which is provided to one of the fixed side portion and the moving side portion, and which is capable of being projected and retracted along a direction in which the container support is moved between the storage position and the transfer position wherein the movable nozzle is urged toward a projected side by urging means;
   a recessed portion which is provided to the other of the fixed side portion and the moving side portion, and which the movable nozzle can be inserted into or moved out of, wherein the movable nozzle is provided with an internal flow path for communicating a fixed side gas flow path in the fixed side portion with a moving side gas flow path in the moving side portion to allow the inert gas to flow along the direction in which the container support is moved when the movable nozzle is inserted into the recessed portion; and
   a sealing member for sealing any gap between the recessed portion and the movable nozzles when the movable nozzle is inserted into the recessed portion.

4. A container storage facility as defined in claim 3, wherein
   the internal flow path comprises a straight flow path extending through an interior of the movable nozzle in the direction in which the container support is moved.

5. A container storage facility as defined in claim 3, wherein
   the internal flow path includes a straight first flow path portion that extends from a projected side end—in the direction in which the container support moved—of the movable nozzle to a location just before a retrieved side end, and a second flow path portion which communicates the first flow path portion with an exterior of the movable nozzle in a radial direction of the movable nozzle at a location on a retrieved side of the movable nozzle, and wherein
   blocking and opening means is provided for blocking the second flow path portion when the container support is located at the transfer position and for opening the second flow path portion when the container support is located at the storage position.

6. A container storage facility as defined in claim 1, wherein
   the transporting means comprises an article transporting vehicle which is movable along a travel path that extends adjacent to a container transfer location associated with the container storage section, and which has a holding portion for holding the container, wherein
   the storage position is set to be at a location away from the travel path, and the transfer position is set to be at a location closer to the travel path than the storage position, wherein
   the container storage facility further comprises:
   means for supporting the container support such that the position of the container support can be changed between the storage position and the transfer position; and
   an operated member movable between a proximate position close to the vehicle which is stopped at the container transfer location and a spaced apart position farther away from the vehicle,
   wherein the operated member is operatively connected to the means for supporting the container support such that the container support is caused to be at the storage position when the operated member is at the proximate position, and the container support is caused to be at the transfer position when the operated member is at the spaced apart position, and wherein
   the vehicle includes push-pull type operating means for pushing the operated member from the proximate position to the spaced apart position by a projecting movement away from the vehicle, and for pulling the operated member from the spaced apart position to the proximate position by a retracting movement toward the vehicle.

7. A container storage facility as defined in claim 6, wherein
the travel path and the fixed frame member are provided to the ceiling, wherein
the means for supporting the container support is configured to be a slide guiding mechanism for suspending and supporting an upper end of the container support to the fixed frame member for sliding movement, wherein
the container support is configured to receive and support the container and to be movable with a central portion thereof in a right and left direction as seen along a direction of its movement being suspended and supported by the slide guiding mechanism, wherein
the fixed frame member has a dimension, in the right and left direction as seen in the direction in which the container support is moved, that is formed to be smaller than a dimension of the container support in the right and left direction, wherein
the operated member is located on one side of the fixed frame member in the right and left direction as seen in the direction in which the container support is moved, wherein
the connecting member of the gas supply line is located on the other side of the fixed frame member in the right and left direction as seen in the direction in which the container support is moved, and wherein
the moving side portion of the gas supply line is located on the other side in the right and left direction of the fixed frame member as seen in the direction in which the container support is moved, such that the moving side portion is adjacent to the container support.

8. A container storage facility comprising:
a vehicle for transporting a container for holding at least one substrate;
a container storage section for storing the container transported by the vehicle, wherein the container storage section includes a fixed frame member fixedly provided and a container support configured to be moved with respect to the fixed frame member between a storage position for storing the container and a transfer position for transferring the container to or from the vehicle;
a gas supply system for supplying inert gas, through a gas supply line, to the container supported by the container support located at the storage position is provided, wherein the gas supply line includes a fixed side portion provided to the fixed frame member, a moving side portion provided to the container support so as to be moved in unison with the container support, and a connecting member for connecting the fixed side portion and the moving side portion to each other as the container support is moved from the transfer position to the storage position, and for releasing the connection between the fixed side portion and the moving side portion to allow the moving side portion to move away from the fixed side portion as the container support is moved from the storage position to the transfer position.

9. A container storage facility as defined in claim 8 further comprising:
a storage position sensor for detecting that the container support is located at the storage position;
a support state detection sensor for detecting that the container is supported by the container support;
an inert gas supply control that, based on detected information from the storage position sensor and the support state detection sensor, allows the inert gas to be supplied by the gas supply line when the container support is located in the storage position and the container is supported by the container support, and that prevents the inert gas from being supplied by the gas supply line when the container support is not located in the storage position or when the container is not supported by the container support.

10. A container storage facility as defined in claim 8, wherein
the connecting member includes:
a movable nozzle which is provided to one of the fixed side portion and the moving side portion, and which is configured he projected and retracted along a direction in which the container support is moved between the storage position and the transfer position wherein the movable nozzle is urged toward a projected side by urging means;
a recessed portion which is provided to the other of the fixed side portion and the moving side portion, and which the movable nozzle can be inserted into or moved out of, wherein the movable nozzle is provided with an internal flow path for communicating a fixed side gas flow path in the fixed side portion with a moving side gas flow path in the moving side portion to allow the inert gas to flow along the direction in which the container support is moved when the movable nozzle is inserted into the recessed portion; and
a sealing member for sealing any gap between the recessed portion and the movable nozzles when the movable nozzle is inserted into the recessed portion.

11. A container storage facility as defined in claim 10, wherein
the internal flow path comprises a straight flow path extending through an interior of the movable nozzle in the direction in which the container support is moved.

12. A container storage facility as defined in claim 10, wherein
the internal flow path includes a straight first flow path portion that extends from a projected side end—in the direction in which the container support moved—of the movable nozzle to a location just before a retrieved side end, and a second flow path portion which communicates the first flow path portion with an exterior of the movable nozzle in a radial direction of the movable nozzle at a location on a retrieved side of the movable nozzle, wherein
a blocking and opening mechanism is provided for blocking the second flow path portion when the container support is located at the transfer position and for opening the second flow path portion when the container support is located at the storage position.

13. A container storage facility as defined in claim 8, wherein
the vehicle is configured to move along a travel path that extends adjacent to a container transfer location associated with the container storage section, and has a holding portion for holding the container, wherein
the storage position is set to be at a location away from the travel path, and the transfer position is set to be at a location closer to the travel path than the storage position, wherein
the container storage facility further comprises:
a mechanism for supporting the container support such that the position of the container support can be changed between the storage position and the transfer position; and an operated member movable between a proximate position close to the moving vehicle which is stopped at the container transfer location and a spaced apart position farther away from the moving vehicle, wherein the operated member is operatively connected to the mechanism for supporting the container support such that the container support is caused to be at the storage position when the operated member is at the proximate position, and the container support is caused to be at the transfer position when the operated member is at the spaced apart position, and wherein the moving vehicle includes a push-pull type operating mechanism for pushing the operated member from the proximate position to the spaced apart position by a projecting movement away from the moving vehicle, and for pulling the operated member from the spaced apart position to the proximate position by a retracting movement toward the moving vehicle.

14. A container storage facility as defined in claim 13, wherein the travel path and the fixed frame member are suspended from the ceiling, wherein the mechanism for supporting the container support is configured to be a slide guiding mechanism for suspending and supporting an upper end of the container support to the fixed frame member for sliding movement, wherein the container support is configured to receive and support the container and to be moved with a central portion thereof in a right and left direction as seen along a direction of its movement being suspended and supported by the slide guiding mechanism, wherein the fixed frame member has a dimension, in the right and left direction as seen in the direction in which the container support is moved, that is formed to be smaller than a dimension of the container support in the right and left direction, wherein the operated member is located on one side of the fixed frame member in the right and left direction as seen in the direction in which the container support is moved, wherein the connecting member of the gas supply line is located on the other side of the fixed frame member in the right and left direction as seen in the direction in which the container support is moved, and wherein the moving side portion of the gas supply line is located on the other side in the right and left direction of the fixed frame member as seen in the direction in which the container support is moved, such that the moving side portion is adjacent to the container support.

* * * * *

UNITED STATES PATENT AND TRADEMARK OFFICE
CERTIFICATE OF CORRECTION

PATENT NO. : 8,926,251 B2
APPLICATION NO. : 13/211757
DATED : January 6, 2015
INVENTOR(S) : Yukio Iizuka et al.

Page 1 of 1

It is certified that error appears in the above-identified patent and that said Letters Patent is hereby corrected as shown below:

In the Claims

Column 19, Line 57, Claim 2, delete "to he" and insert -- to be --

Column 22, Line 14, Claim 10, delete "he" and insert -- be --

Signed and Sealed this
Fifth Day of May, 2015

Michelle K. Lee
*Director of the United States Patent and Trademark Office*